United States Patent [19]
Kroske

[11] Patent Number: 6,031,730
[45] Date of Patent: Feb. 29, 2000

[54] CONNECTOR FOR ELECTRICALLY CONNECTING CIRCUIT BOARDS

[75] Inventor: Scott B. Kroske, Commerce Township, Mich.

[73] Assignee: Siemens Automotive Corporation, Auburn Hills, Mich.

[21] Appl. No.: 09/193,195

[22] Filed: Nov. 17, 1998

[51] Int. Cl.[7] ................................................... H05K 1/14
[52] U.S. Cl. .......................... 361/784; 361/784; 361/803; 361/789; 439/66; 439/74
[58] Field of Search .................................... 361/784, 803, 361/789; 439/66, 74

[56] References Cited

U.S. PATENT DOCUMENTS

| | | | |
|---|---|---|---|
| 3,951,493 | 4/1976 | Kozel et al. | 439/591 |
| 5,224,023 | 6/1993 | Smith et al. | 361/784 |
| 5,448,511 | 9/1995 | Paurus et al. | 365/52 |
| 5,646,446 | 7/1997 | Nicewarner, Jr. et al. | 257/723 |
| 5,717,556 | 2/1998 | Yanagida | 361/803 |
| 5,742,484 | 4/1998 | Gillette et al. | 361/789 |
| 5,769,645 | 6/1998 | Martin et al. | 439/79 |
| 5,917,149 | 6/1999 | Barcley et al. | 174/35 C |

*Primary Examiner*—Leo P. Picard
*Assistant Examiner*—David Foster

[57] ABSTRACT

Connector for electrically connecting generally rigid circuit boards together comprises at least one electrically conductive member having opposing ends and a connection lead at each end thereof. Each lead is constructed and arranged to be connected to a connection location of an associated circuit board using a surface mounting technique, for example re-flow soldering. The conductive member has a flexible bridging portion between the leads. The bridging portion is constructed and arranged to have a first linear dimension between the leads in an unbiased condition and is capable of being expanded to have an expanded linear dimension between the leads greater than the first linear dimension, and being compressed to have a compressed linear dimension between the leads less than the expanded linear dimension, such that when the connector is interconnecting the two circuit boards, one circuit board may be moved with respect to the other circuit board so that the circuit boards may face each other in spaced relation with the circuit boards being movable toward and away from each other to adjust the spacing therebetweeen.

20 Claims, 5 Drawing Sheets

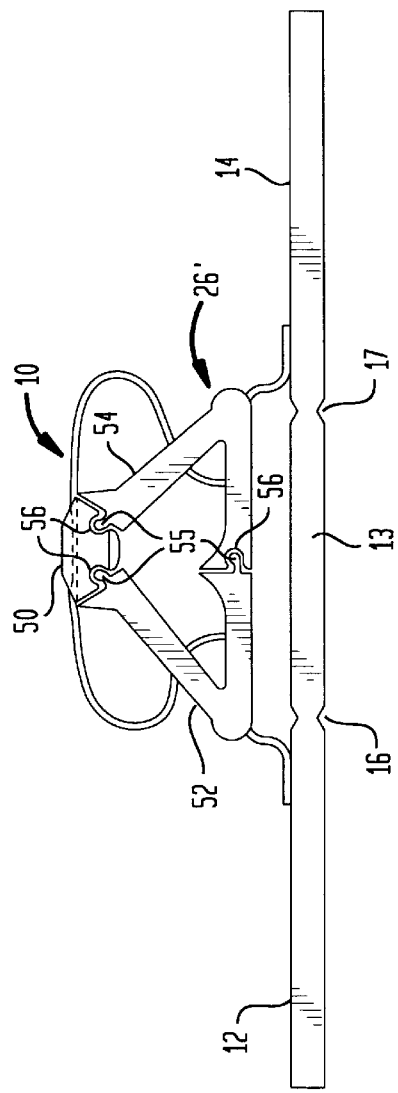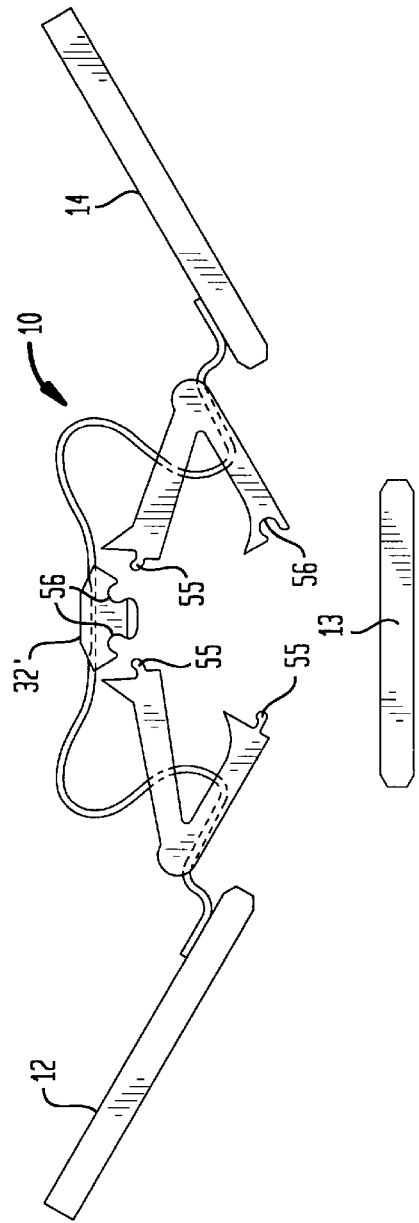

CONNECTOR FOR ELECTRICALLY CONNECTING CIRCUIT BOARDS

FIELD OF THE INVENTION

This invention relates to an apparatus and a method for connecting circuit boards, and more particularly to a flexible, surface-mounted connector for joining generally rigid circuit boards together, so that the circuit boards may be easily manipulated with respect to each other when being mounted in a housing.

BACKGROUND OF THE INVENTION

Automotive engine control modules generally include a housing which contains circuit boards which include circuitry to control engine operating parameters. It is often necessary to electrically connect at least two of the circuit boards together and to fold the circuit boards so as to be in facing relation so as to be accommodated in the housing. To facilitate such placement, the electrical interconnection between the circuit boards should have some degree of flexibility. Further, for mass production, it is preferable to use a surface mounting technique to mount electrical components to the circuit boards and to make the interconnection between the circuit boards.

One approach is to employ a flexible substrate defining each circuit board and using a flexible interconnection between each flexible substrate. However, flexible substrates are costly and generally have two-layer construction which means only two circuits can be provided on each substrate. Further, the flexible substrates are difficult to laminate and delamination is a concern during manufacture and assembly.

Rigid circuit boards are less costly and advantageously provide four or more layer construction. However, it is difficult to interconnect rigid circuit boards using surface mounting techniques to permit the circuit boards to be disposed in facing or stacked relation because the connector must provide both sufficient rigidity and flexibility during the placement and assembly process. In particular, the connector must be sufficiently rigid during placement and soldering onto the circuit boards, sufficiently flexible to allow relative movement of the circuit boards during assembly, and then sufficiently rigid to prevent contact between the leads and between the leads and the housing during normal operation.

Accordingly, a need exists to provide an apparatus and a method for electrically connecting two generally rigid circuit boards using surface mounting techniques whereby the circuit boards may be manipulated with respect to each other when mounting the circuit boards in a housing.

SUMMARY OF THE INVENTION

An object of the present invention is to fulfill the need referred to above. In accordance with the principles of the present invention, this objective is obtained by providing a connector apparatus for electrically connecting two generally rigid circuit boards together. Connector includes at least one electrically conductive member having opposing ends and a connection lead at each end thereof. Each lead is constructed and arranged to be connected to a connection location of a circuit board using surface mounting techniques, such as re-flow soldering. The conductive member has a flexible bridging portion between the leads. The bridging portion is constructed and arranged to have a first linear dimension between the leads in an unbiased condition and is capable of (1) being expanded to have an expanded linear dimension between the leads greater than the first linear dimension, and (2) being compressed to have a compressed linear dimension between the leads less than the expanded linear dimension, such that when connector is interconnecting the two circuit boards, one circuit board may be moved with respect to the other circuit board so that the circuit boards may be disposed in spaced relation, with the circuit boards being movable toward and away from each other to adjust the spacing therebetween.

In accordance with another aspect of the invention, a circuit board assembly is provided and includes at least first and second generally rigid circuit boards each having connection locations and a flexible connector electrically connecting the two circuit boards together. Connector includes at least one electrically conductive member having opposing ends and a connection lead at each end thereof. The leads are connected to a connection location of an associated circuit board using surface mounting techniques, such as re-flow soldering. The conductive member has a bridging portion between the leads. The bridging portion is constructed and arranged to have a first linear dimension between the leads in an unbiased condition and is capable of (1) being expanded to have an expanded linear dimension between the leads greater than the first linear dimension, and (2) being compressed to have a compressed linear dimension between the leads less than the expanded linear dimension, such that the first circuit board may be moved with respect to the second circuit board from a first position, wherein the circuit boards are adjacent and disposed generally in a common plane with connector therebetween, to a second position wherein the circuit boards face each other in spaced relation with the circuit boards being movable towards and away from each other to adjust the spacing therebetweeen.

A method of mounting a circuit board assembly, comprising two or more generally rigid circuit boards connected together using surface mounting techniques, in a housing is also provided.

Other objects, features and characteristic of the present invention, as well as the methods of operation and the functions of the related elements of the structure, the combination of parts and economics of manufacture will become more apparent upon consideration of the following detailed description and appended claims with reference to the accompanying drawings.

BRIEF DESCRIPTION OF THE DRAWINGS

FIGS. 8a–b each show an end view of an alternative embodiment of the present invention.

DETAILED DESCRIPTION OF THE EXEMPLARY EMBODIMENTS

Figure 1:
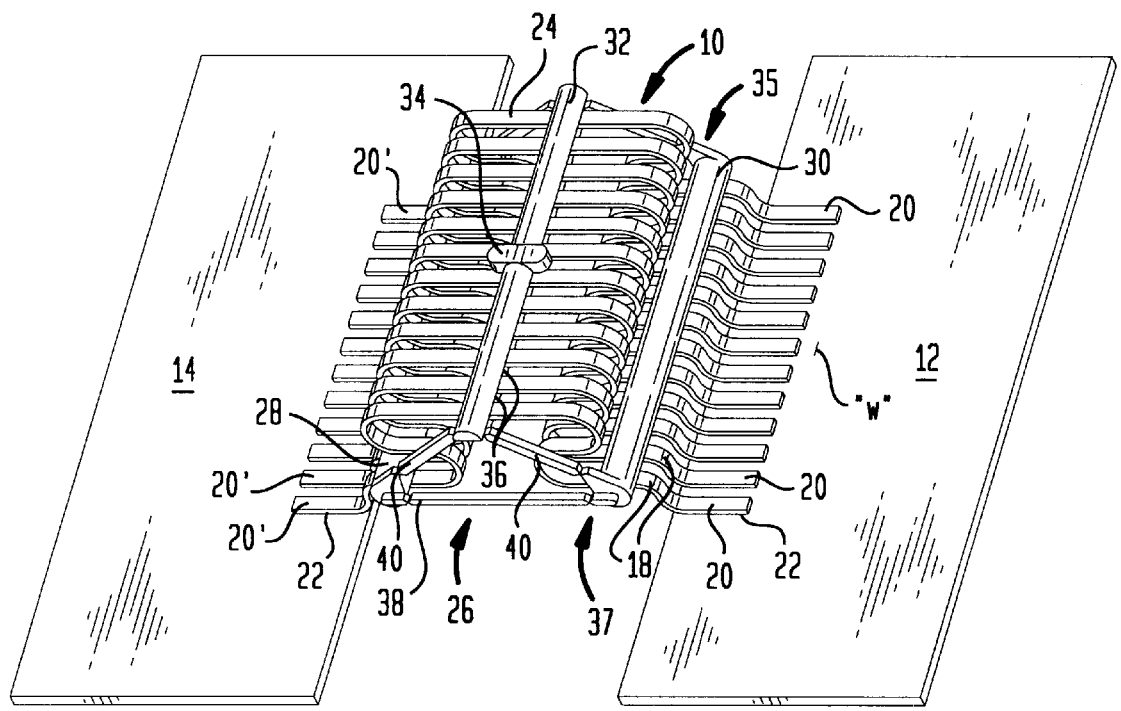
FIG. 1 is a perspective view of connector provided in accordance with the principles of the present invention, shown interconnecting two circuit boards to define a circuit board assembly.

Referring to FIG. 1, connector 10 in accordance with the principles of the present invention is shown electrically connecting two generally rigid circuit boards 12 and 14 together. In the illustrated embodiment, circuit boards 12 and 14 are preferably thin FR4 laminates each having similar dimensions so as to be capable of being disposed in facing or stacked relation so as to fit within a confined space as described further below. As shown in FIG. 1, circuit boards 12 and 14 are manufactured to be in generally the same plane. Initially, circuit boards 12 and 14 are connected at ends thereof by a breakable joint which may be broken to separate circuit boards 12 and 14 once connector 10 is joining circuit boards 12 and 14. Circuit boards 12 and 14 are constructed to be compatible with surface mounting technology and can have surface mounted components thereon as is known in the art.

In the illustrated embodiment, connector 10 comprises a plurality of electrically conductive members 18, each having opposing ends. It can be appreciated that in the broadest aspect of the invention, connector 10 may include only one conductive member 18. Each conductive member 18 comprises bridging portion 24 having connection leads 20 and 20' at each opposing end thereof. Advantageously leads 20 and 20' are generally arranged on a common plane. However one set of leads 20' may be in a plane different from the other set of leads 20 so that the lead sets are in a parallel relationship. Each lead 20 and 20' is constructed and arranged to be connected to a respective connection location 22, which may comprise a solder pad placed on respective circuit board 12 or 14, using conventionally known surface mounting techniques, such as re-flow soldering. Each lead 20 and 20' is sized to allow a respective lead 20 or 20' to contact a sufficient portion of respective connection location 22 in order to prevent microcracks in bridging portion 24 due to strain and in the solder fillets on the respective connection location 22.

Each conductive member 18 is preferably made from a thin, flexible plated copper strip or other suitable electrically conductive material. Leads 20 and 20' may be provided so as to be stiffer than bridging portion 24. In the illustrated embodiment, leads 20 and 20' have the same stiffness, height "h", and width "w" as bridging portion 24. For example, the width "w" of each conductive member 18 may be about 1 mm and the height "h" of each conductive member 18 are preferably between about 0.125 mm and 0.25 mm. Of course, the dimensions of conductive members 18 are for illustrative purposes only and can be selected for the particular application and are thus not limited to the above dimensions.

Figure 2:
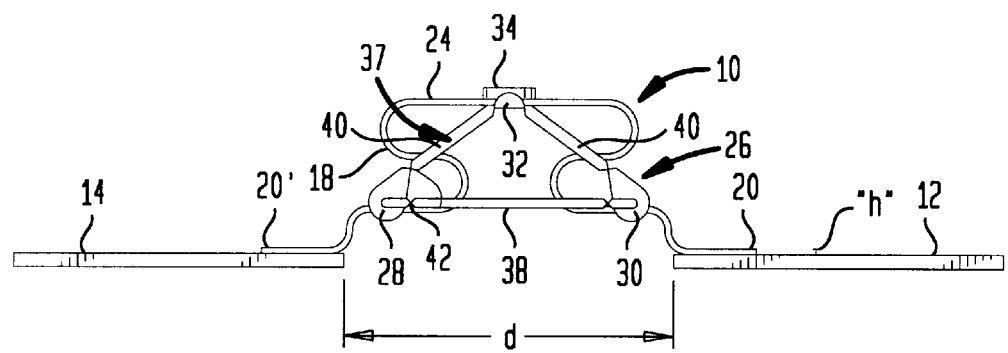
FIG. 2 is an end view of connector of FIG. 1 shown in an unbiased condition.
Figure 5:
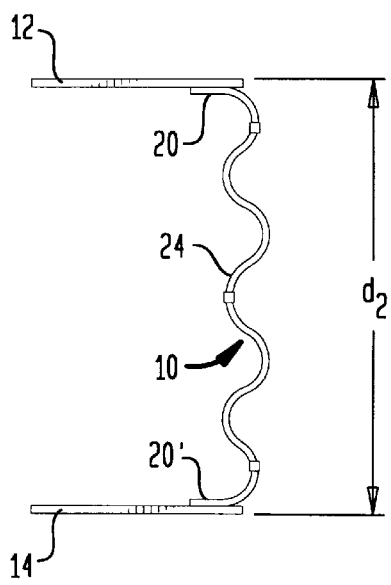
FIG. 5 is an end view of connector of FIG. 3 shown in an expanded condition.
Figure 6:
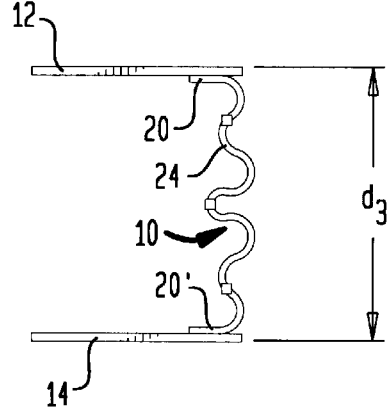
FIG. 6 is an end view of connector of FIG. 3 shown in a compressed condition.
Figure 4:
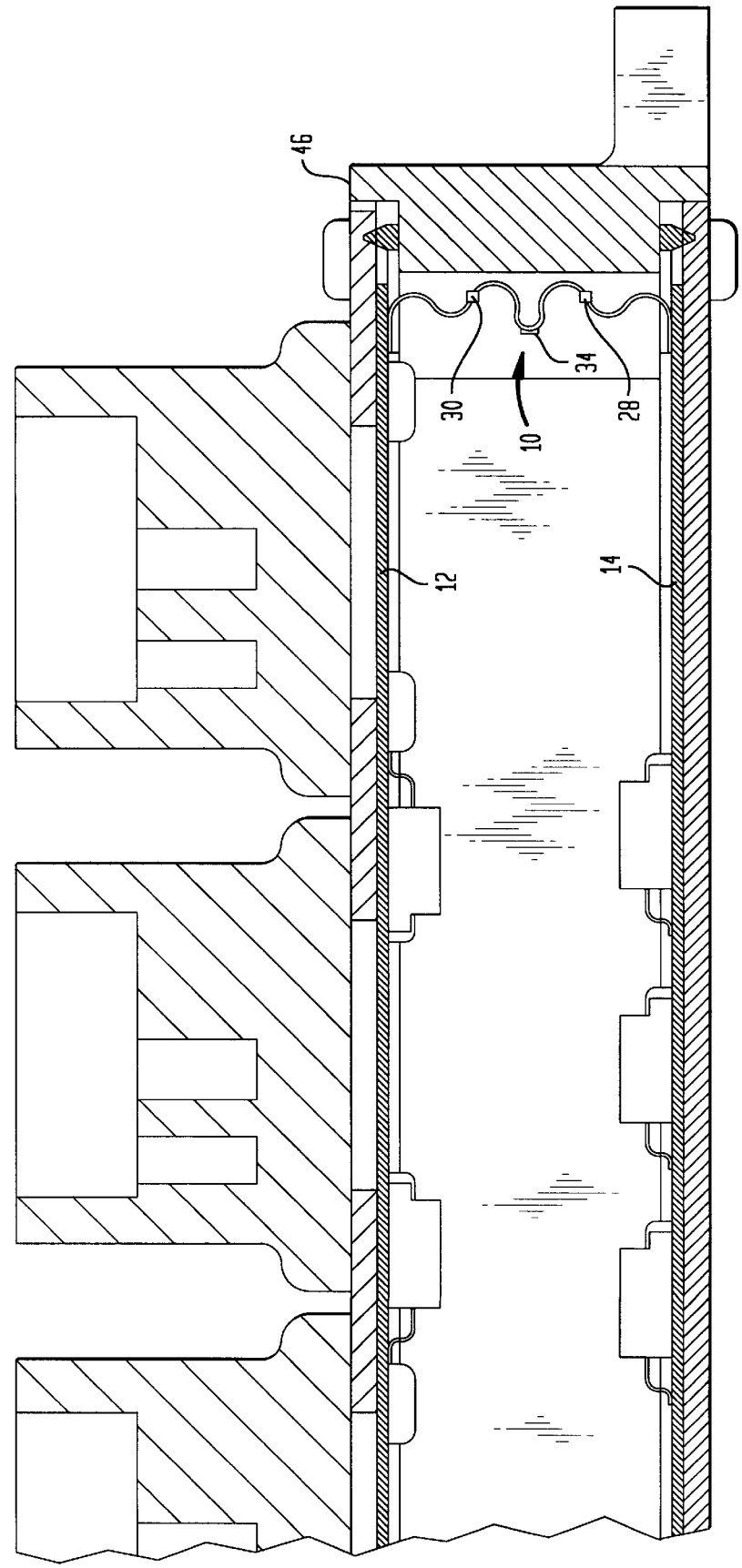
FIG. 4 is a partial cross-sectional view of the circuit board assembly of FIG. 1 shown mounted in a housing, wherein one circuit board faces the other circuit board with connector therebetween.
Figure 7A:
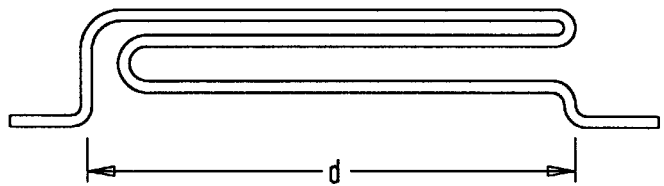
FIGS. 7a–7f each show an end view of an alternative embodiment of connector of the invention.
Figure 7B:
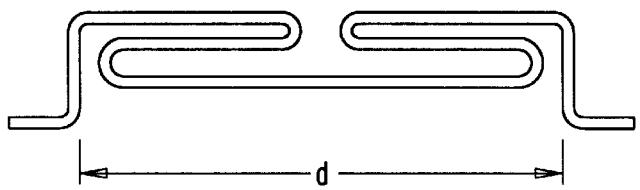
Figure 7C:
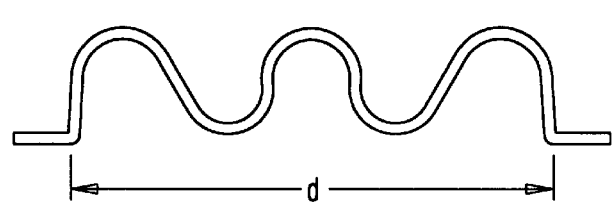
Figure 7D:
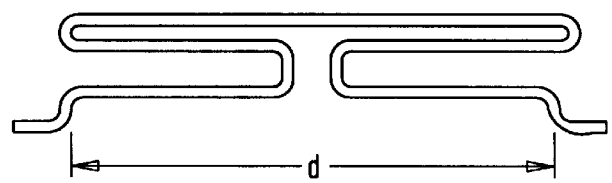
Figure 7E:
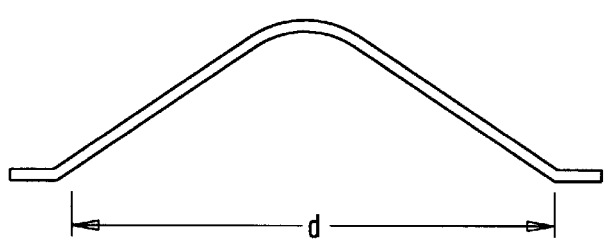
Figure 7F:
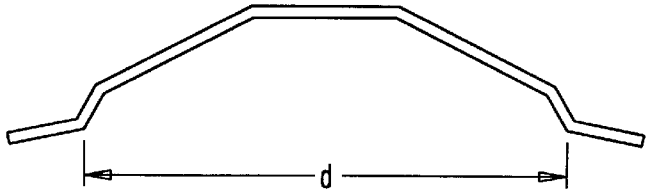

With reference to FIG. 2, bridging portion 24 is constructed and arranged to have a certain linear dimension "d" between leads 20 and 20' in a first, unbiased or relaxed condition. Bridging portion 24 is constructed and arranged to be capable of being disposed in an expanded condition (FIG. 5) to have an expanded linear dimension "d2" between leads 20 and 20' which is greater than dimension "d". Bridging portion 24 is also constructed and arranged to be capable of being disposed in a compressed condition (FIG. 6) to have a compressed linear dimension "d3" between leads 20 and 20' which is less than the expanded linear dimension "d2".

As noted above, the construction and arrangement of bridging portion 24 permits the above mentioned compression and expansion of connector 10. Bridging portion 24 may be of a variety of configurations as shown for example, in FIG. 1 and FIGS. 7a–7f. In each configuration, an overall length (e.g., the length when straightened but not while being compressed or expanded) of bridging portion 24 is greater than the dimension "d" and permit expansion thereof. In addition, since bridging portion 24 is flexible, connector 10 is capable of being expanded or compressed as necessary.

As shown in FIG. 1, when connector 10 comprises a plurality of conductive members 18 provided in spaced relation, it is preferable to support individual conductive members 18 during assembly with circuit boards 12 and 14, and to maintain adjacent leads in spaced relation. Further, it is desirable to have connector 10 be compatible with high volume automated assembly equipment such as, but not limited to, vacuum pick-and-place equipment to facilitate assembly of the printed circuit board modules. In that regard, connector 10 includes a carrier structure, operatively associated with conductive members 18. In the illustrated embodiment of FIG. 1, carrier 26 is composed of plastic and has first outer support member 28 and second outer support member 30, each overmolded to each conductive member 18 generally near the leads 20 and 20' thereof. Carrier 26 also includes center support member 32 overmolded to each conductive member 18 at each bridging portion 24 thereof. Center support member 32 includes generally planar surface 34 suitable for use in a vacuum pick-and-place operation. In addition, center support member 32 includes a plurality of projecting tabs 36 which act as spacers to maintain a specified spacing between the adjacent leads.

Carrier 26 further includes end members, generally indicated at 35 and 37, each having a generally triangular configurations which couple support members 28, 30 and 32 together and which add rigidity to connector 10. As shown in FIGS. 1 and 2, each end member 35 and 37 includes lower element 38 coupled to outer support members 28 and 30 and angled elements 40 coupling an associated outer support member to central support member 32. Each of the ends of the lower and angled elements are joined to the associated support member via shear or breakable connection 42 so that the lower and angled elements may be removed from carrier 26 as will be explained more fully below. Alternatively, instead of providing breakable connections, end members 35 may be removably connected to the support members by a snap-fit arrangement.

FIGS. 8a–b illustrate another embodiment of the present invention wherein the carrier structure includes provisions for allowing portions of the carrier to break off without having to shear the portions apart. In this embodiment, carrier 26' breaks apart into support elements 50, 52 and 54 when circuit boards 12 and 14 are folded about connector 10. As shown in FIGS. 8a–b, support elements 50, 52 and 54 each comprise respective snap on portions 55 and 56 which may be operatively coupled to respective portions 56 and 55 to form carrier 26'.

Advantageously, support elements 50, 52 and 54 are molded onto the conductive leads in a fashion as to allow the frame to be snapped together during the final lead bending process. Connector 10 would then be placed onto circuit boards 12 and 14, which are connected by middle piece 13 through breakable joints 16 and 17, and soldered in place. As shown in FIG. 8b, carrier 26' breaks apart as connector 10 expands when circuit boards 12 and 14 are folded with respect to each other. It can be seen that carrier 26' obviates the need to shear a plastic frame apart during the circuit board break out operation. It is to be understood that the break apart feature may be implemented using any method that allows the plastic frame to easily break apart when the boards are moved in a particular manner with respect to each other, including, but not limited to, providing perforations or weakened joints at the desired portions.

Although specific configurations of carrier 26 have been described above, it can be appreciated that the configuration of carrier 26 can be specific to the particular configuration of connector 10. Regardless of the specific configuration of carrier 26, carrier 26 should be capable of maintaining leads 20 in a spaced apart relation, be capable of supporting conductive members 18 and provide a pick-and-place compatible surface. Advantageously, carrier 26 is constructed to be capable of disassociating from connector 10 either through shearing or snap-fit arrangements.

Connector 10 is constructed and arranged to withstand high vibration and thermal shock without shorting the leads or causing the leads or solder joint to fail.

A manufacturing process to provide the plurality of conductive members joined with carrier 26 is as follows. First, a progressive die is used to stamp out conductive members 18. At this stage, conductive members 18 are flat members and all adjacent leads are attached to each other to define a connection assembly. Next, the connection assembly is inserted in a die of a plastic injection molding machine. The die is closed around the connection assembly and plastic is injected around the connection assembly to form carrier 26 in an overmolding process. Next, a stamping process is performed on the connection assembly to provide the desired shape of bridging portion 24, with the adjacent leads remaining attached. The connection assembly with overmolded carrier 26 are then placed into a shear die to remove the portions of metal which are still connecting the adjacent leads. It is possible to incorporate the final shear into the die for the injection molding process. Since co-planarity or parallelism of the leads is important, an additional stamping process may be performed to ensure that all leads are within a certain tolerance. It can be appreciated that the sequence of the manufacturing process described above is exemplary only. For example, the stamping process may occur prior to overmolding.

Figure 3:
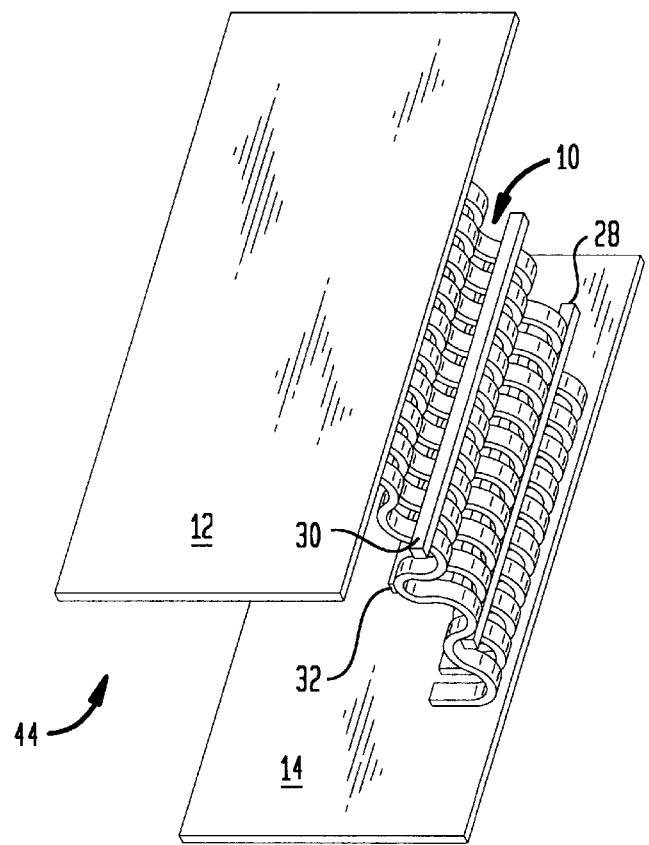
FIG. 3 is a perspective view of the circuit board assembly of FIG. 1, showing one circuit board being folded about connector to face the other circuit board.

Once leads 20 and 20' of connector 10 are re-flow soldered to associated connection locations 22 of each circuit board 12 and 14, the breakable joint between the circuit boards is sheared and elements 38 and 40 of each end member of carrier 26 are sheared from the support members leaving outer support members 28 and 30 and central support member 32 coupled with conductive members 18. This defines a circuit board assembly, generally indicated at 44 in FIG. 3, and permits relative motion of circuit boards 12 and 14 about connector 10.

Advantageously, circuit boards 12 and 14 may be part of a circuit module disposed within a housing, for example an automotive engine control module. Thus, with reference to FIG. 3, circuit board 12 is folded about connector 10 so as to be in generally facing relation with circuit board 14. The folded circuit board assembly is mounted in module housing 46. Often, tolerance stack-up of the circuit boards within housing 46 requires that circuit boards 12 and 14 be moved toward or away from each other. In addition, when assembling circuit boards 12 and 14 into housing 46, it is often necessary to expand connector 10 to increase the distance between the circuit boards to a distance greater than distance "d" (FIG. 2) to facilitate entry of circuit boards 12 and 14 into housing 46. As described above, the construction and arrangement of bridging portion 24 of connector 10 permits compression or expansion to accommodate assembly of circuit boards 12 and 14 into housing 46.

Although in the exemplary embodiments only two circuit boards are interconnected via connector 10, it can be appreciated that multiple circuit boards can be connected together and disposed in a spaced, stacked relation by employing a plurality of connectors. Further, in joining two circuit boards, multiple connectors 10 can be employed.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A connector, comprising:

an electrically conductive member having opposing ends and a connection lead at each end thereof, each said connection lead adapted to be connected to a connection location of an associated circuit board, said conductive member having a flexible bridging portion between said connection leads, said bridging portion being constructed and arranged to have a first linear dimension between said leads in an unbiased condition and being capable of being expanded to have an expanded linear dimension between the leads greater than said first linear dimension, and being compressed to have a compressed linear dimension between the leads less than said expanded linear dimension, whereby one circuit board may be moved with respect to the other circuit board so that the circuit boards may lie proximate each other in spaced relation with said circuit boards being movable toward and away from each other to adjust the orientation of each with respect to the other, said connector further comprising a carrier operatively associated with said connective member, said carrier having a first and second support members disposed proximate to and supportive of said opposite ends of said connective member while said flexible bridging portion is arranged in said unbiased condition to maintain said opposite ends in spaced relationship, said first and second support members in detachable flexible communication with each other, whereby flexing of said carrier permits said circuit boards to be reoriented with respect to each other while maintaining said flexible bridging portion in its unbiased linear dimension, and whereby detachment of said first and second support members from each other permits said bridging portion to be expanded and compressed as said circuit boards are moved toward and away from each other to further adjust the respective orientation thereof.

2. The connector according to claim 1, wherein said electrically conductive member comprises a plurality of conductive members disposed in a spaced relation.

3. The connector according to claim 2, wherein said carrier is operatively associated with said plurality of conductive members, said carrier adapted to support said conductive members and to maintain said conductive members in spaced relation.

4. The connector according to claim 3, wherein said carrier includes an outer support member connected to each of said conductive members near each said opposing leads thereof and a generally central support member connected to said bridging portion.

5. The connector according to claim 4, wherein said support members are composed of plastic material overmolded onto said conductive members.

6. The connector according to claim 3, wherein said carrier is composed of plastic material.

7. The connector according to claim 3, wherein said carrier includes a generally planar surface adapted to be employed as a contact surface to allow placement of said connector and associated circuit boards by automated assembly equipment.

8. The connector according to claim 3, wherein said carrier comprises a plurality of carrier portions joined together by respective separable portions, said carrier portions separating from each other in response to a relative movement between the circuit boards.

9. The connector according to claim 1, wherein said at least one conductive member is composed of plated copper.

10. The connector according to claim 1, wherein said connection leads are generally disposed on a common plane.

11. A circuit board assembly, comprising:

first and second circuit boards, each having connection locations; and a connector electrically connecting said first and second circuit boards together, said connector comprising at least one electrically conductive member having opposite ends and a connection lead at each end thereof, said leads capable of being connected to a connection location of an associated circuit board using surface mounting techniques, said conductive member having a bridging portion between said leads, said bridging portion being constructed and arranged to have a first linear dimension between said leads in an unbiased condition and being capable of being expanded to have an expanded linear dimension between the leads greater than said first linear dimension, and being compressed to have a compressed linear dimension between the leads less than said expanded linear dimension, such that said first circuit board may be moved with respect to said second other circuit board from a first position wherein said circuit boards are generally disposed in a common plane with said connector therebetween to a second position wherein said circuit boards lie proximate each other in spaced relation with said circuit boards being movable toward and away from each other to adjust the orientation of each with respect to the other, said connector further comprising a carrier operatively associated with said connective member, said carrier having a first and second support members disposed proximate to and supportive of said opposite ends of said connective member while said flexible bridging portion is arranged in said unbiased condition to maintain said opposite ends in spaced relationship, whereby flexing of said carrier permits said circuit boards to be reoriented with respect to each other while maintaining said flexible bridging portion in its unbiased linear dimension, and whereby detachment of said first and second support members from each other permits said bridging portion to be expanded and compressed as said circuit boards are moved toward and away from each other to further adjust the respective orientation thereof.

12. The circuit board assembly according to claim 11, wherein said conductive members comprise a plurality of conductive members disposed in a spaced relation.

13. The circuit board assembly according to claim 12, wherein said carrier is operatively associated with said plurality of conductive members, said carrier being constructed and arranged to support said conductive members and to maintain said conductive members in spaced relation.

14. The circuit board assembly according to claim 13, wherein said generally central support member includes a generally planar surface adapted to be employed as a contact surface to allow placement of said circuit board assembly by automated assembly equipment.

15. The circuit board assembly according to claim 13, wherein said carrier includes an outer support member connected to each of said conductive members near each of the opposing leads thereof and a generally central support member connected to said bridging portion.

16. The circuit board structure according to claim 15, wherein said support members are composed of plastic material overmolded onto said conductive members.

17. The circuit board assembly according to claim 13, wherein said carrier comprises a plurality of carrier portions joined by respective separable joints, said carrier portions separating from each other in response to a movement of said first circuit board relative to said second circuit board.

18. The circuit board assembly according to claim 11, wherein said at least one conductive member is composed of plated copper.

19. The circuit board assembly according to claim 11, wherein said connection leads are generally arranged on a common plane.

20. A method of mounting a circuit board assembly into a housing, comprising:

electrically joining a connector to a pair of generally rigid circuit boards using a surface mounting technique, the connector comprising at least one electrically conductive member having opposing ends and a connection lead at each end thereof, the conductive member having a bridging portion between the leads, the bridging portion being constructed and arranged to have a first linear dimension between the leads in an unbiased condition and being capable of being expanded to have an expanded linear dimension between the leads greater than the first linear dimension, and being capable of being compressed to have a compressed linear dimension between the leads less than the unbiased linear dimension, said opposing ends supported by a separable carrier, said carrier remaining in an unseparated state unless and until it is separated;

folding one of the circuit boards about the connector and inserting both of the circuit boards in the housing such that the circuit boards are in spaced relation, wherein folding of said circuit boards about the connector does not result in separation of said carrier;

adjusting a distance between the circuit boards by one of expanding and compressing the connector, wherein said carrier becomes separated as a result of such expansion and compression; and mounting the circuit boards to the housing.

* * * * *